United States Patent
Ho

(10) Patent No.: US 6,838,702 B1
(45) Date of Patent: Jan. 4, 2005

(54) LIGHT EMITTING DIODE

(75) Inventor: Wen-Chih Ho, Taoyuan (TW)

(73) Assignee: Lambda Opto Technology Co., LTD, Taoyuan (TW)

( * ) Notice: Subject to any disclaimer, the term of this patent is extended or adjusted under 35 U.S.C. 154(b) by 0 days.

(21) Appl. No.: 10/682,425

(22) Filed: Oct. 10, 2003

(51) Int. Cl.[7] .................... H01L 27/15; H01L 31/12; H01L 33/00
(52) U.S. Cl. .................... 257/79; 257/81; 257/95; 257/99; 257/100
(58) Field of Search ............... 257/13, 79–103

(56) References Cited

U.S. PATENT DOCUMENTS 6,756,731 B1 * 6/2004 Sano .................. 313/499

* cited by examiner

*Primary Examiner*—Thien F Tran
(74) *Attorney, Agent, or Firm*—Rabin & Berdo, P.C.

(57) ABSTRACT

A light emitting chip with heat dissipating structure, which emits light as electricity flows through and is applicable as the light source for LED. The light emitting chip is composed of epitaxy chip and electrodes, and uses insulating material with good heat-dissipation to form the substrate of the emission layer. To improve the heat dissipation rate, the substrate has plural openings filled with conducting metals, so the substrate has better heat conductivity and dissipation rate.

6 Claims, 8 Drawing Sheets

LIGHT EMITTING DIODE

BACKGROUND OF THE INVENTION

1. Field of Invention

The present invention relates to a light emitting chip with a heat dissipating structure, which is applicable as the light source for an LED. The light emitting chip is composed of epitaxy chip and electrodes, and uses insulating material with good heat dissipation material to form the substrate of the emission layer. The invention is a light emitting chip with heat dissipating structure built on the substrate.

2. Related Art

Light emitting diode (LED) was invented in the 1970s, and has since influenced the human life dramatically. In the following decades, people have been searching for more practical and efficient light sources. However, many technical bottlenecks cannot be overcome and no major breakthroughs have been made. Many problems still exist when LEDs are applied to daily life, such as light intensity, product life span, etc. In the recent years, due to many technical breakthroughs, LED applications are widely available. The LED has many advantages compared to the traditional light sources, such as: smaller volume, better emission efficiency, longer life span, faster operation and reaction speed, higher reliability, more robust, and can be integrated into small sized, coiling or arrayed elements. These LEDs have no thermal radiation and no toxic material pollution, as with elements such as mercury.

The current LED production technique has already become quite mature, so has improved the level of the light intensity. The current applications for LED include: car dashboard displays, backlit sources for liquid crystal display (LCD) panels, interior lighting, light sources for scanners and fax machines, etc. Future developmental goals focus on producing LEDs with low power consumption, while staying highly efficient and maintaining good light intensity. Also, the micro LED is another important goal. Miniature LEDs are used as the light sources in electronic devices, such as cellular phones, laptops or in the backlit panel of PDA screens. The surface bonding LED is suitable for this kind of demand.

When considering light emitting efficiency, the amount of power acceptable by the light emitting chip in the LED is an important factor. Applications of the high-power light emitting chip can increase the light intensity of a single LED, and thus increase the application range of the LED to areas such as illumination. Therefore, increasing the power of the light emitting chip is a huge challenge when increasing the light intensity of the LED. When increasing power, the first problem is to dissipate heat and lower the raised working temperature as electrical current flows through the light emitting chip. By observing the information disclosed from the known technology, it can be seen that most LEDs have heat dissipating structures added during packaging, which are exterior heat dissipating devices, such as liquid cooled LEDs and air-cooled LEDs. Such heat dissipation design uses exterior utilities, such as sealed masks filled with liquid or gas, to help disperse the working temperature generated by electricity flowing through the LED. Therefore, the working temperature will not get too high and the LED can sustain high-power consumption and not cause optical attenuation. However, even though the exterior design can achieve heat dissipation, it also increases the packaging procedures. Checking whether the exterior heat dissipating design is efficiently combined during packaging is an extra step during the quality control process.

Please refer to FIG. 1 for the illustration of the light emitting chip 10 with heat dissipating substrate, composed of epitaxy chip 11, electrodes 12, and heat dissipating substrate 13. This structure is from the previous invention of the light emitting chip with good heat dissipation. Special material is used for the heat dissipating substrate 13, and heat is dispersed using the characteristics of the substrate. When the epitaxy chip 11 on the light emitting chip 10 conducts the working temperature through electrodes 12 to the heat dissipating substrate 13, heat can be easily dispersed through the substrate 13. The inventor has disclosed that the main material for the substrate consists of ceramics, aluminum oxides or aluminum nitrides, since all these material have a good thermal conduction rate and are suitable for the substrate of the light emitting chip. The invention also aims to design a light emitting chip with a better dissipation rate that is ideal for a wider application range.

SUMMARY OF THE INVENTION

As described above, the invention provides a light emitting chip with good heat dissipation to increase the sustainable power during operation, which broadens the application range of the chip.

The heat dissipating structure of the light emitting chip according to the invention is comprised of an epitaxy chip, two electrodes, and a heat dissipating substrate. The heat dissipating structure is formed on the heat dissipating substrate. Using the good heat conductive characteristic, heat energy generated by the raised working temperature on the epitaxy chip can be transferred to the heat dissipating substrate quickly to disperse heat and thus raise the efficiency of the light emitting chip. The chip can thus be applied more effectively. The electrodes design also allows the light emitting chip to be highly efficient in heat dissipation.

Further scope of applicability of the invention will become apparent from the detailed description given hereinafter. However, it should be understood that the detailed description and specific embodiments, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

Figure 1:
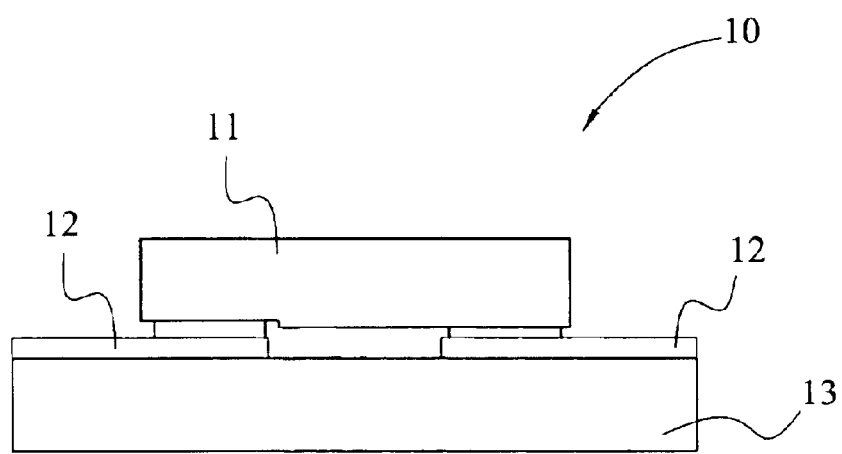
FIG. 1 illustrates, in two-dimensional view, a known light emitting chip.
Figure 2:
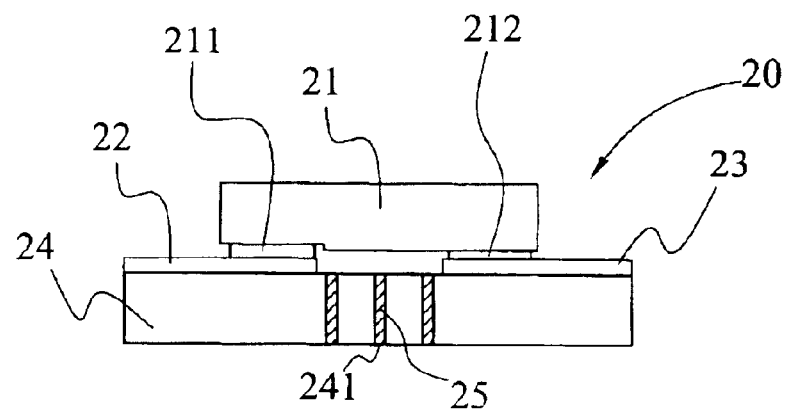
FIG. 2 illustrates the heat dissipating structure of a light emitting chip according to the invention.

Please refer to FIG. 2 for an illustration of the heat dissipating structure of the light emitting chip of the invention. As shown in the illustration, the light emitting chip 20 is composed of an epitaxy chip 21, an electrode set (p-electrode 22 and n-electrode 23), and a heat dissipating substrate 24. The epitaxy chip 21 uses metal blocks 211 and 212 located on the bottom surface of the substrate to connect with the p-electrode 22 and n-electrode 23 that are on top of the heat dissipating substrate 24 to form a complete light emitting chip 20. The figure also shows that the light emitting chip 20 and its electrodes (p-electrode 22 and n-electrode 23) are formed on the bottom surface of the epitaxy chip 21, so the upper surface of the chip is completely exposed. The advantage of an exposed upper surface is that when the light emitting chip 20 conducts electricity and lights up, the entire upper surface of the chip lights up and there is no loss to covered lights. Also, the heat dissipating substrate 24 is composed of highly heat dissipative material, such as ceramics aluminum oxides or aluminum nitrides. When the light emitting chip 20 generates light, the working temperature increases the temperature of the epitaxy chip 21. Using the p-electrode 22 and the n-electrode 23, the heat generated on the epitaxy chip 21 by the working temperature can be transferred to the heat dissipating substrate 24. The heat dissipating substrate of the invention has several openings 241 filled with metals with good heat dissipating properties, such as In or Pd, or their alloys. Heat conducting cylinders 25 are formed in the openings 241; they allow faster transfer of the heat energy through heat conduction by the p-electrode 22 and n-electrode 23 to the bottom of the heat dissipating substrate 24, thus increasing the efficiency of heat dissipation.

Figure 3:
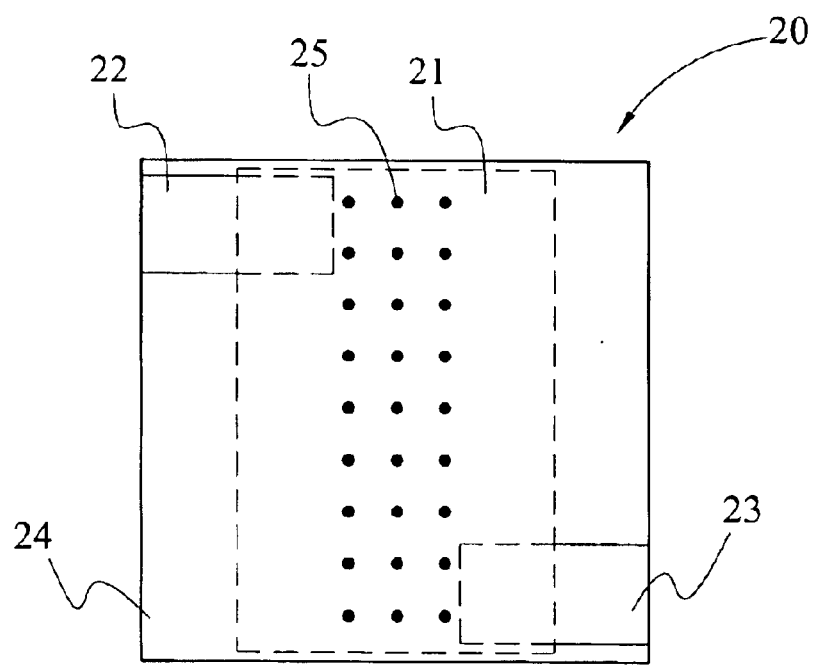
FIG. 3 illustrates, in overview, the heat dissipating structure of a light emitting chip according to the invention.

Please refer to FIG. 3 for illustration of the upper surface of the heat dissipation structure of the light emitting chip. As shown in the illustration, the heat conducting cylinders 25 in the opening 241 are formed scattered on the heat dissipating substrate 24. The illustration shows only one of the better embodiments of the heat dissipating structure of the light emitting chip, the actual layout can be adjusted according to the application and design. The illustration also shows the scattered heat conducting cylinders on the heat dissipating substrate 24 kept away from the p-electrode 22 and n-electrode 23 to avoid short-circuiting when electricity is conducted.

Figure 4:
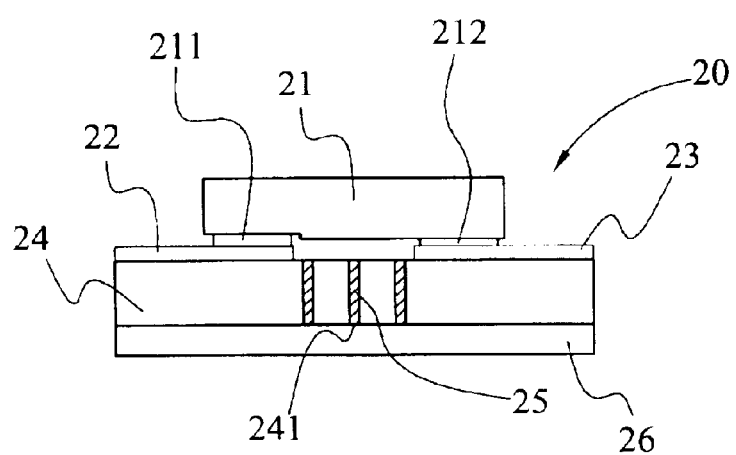
FIG. 4 illustrates the first embodiment of the invention.

Please refer to FIG. 4 for the first embodiment of the invention, which adds a metal heat dissipating layer 26 below the heat dissipating substrate 24 of the light emitting chip 20. This metal heat dissipating layer 26 is composed of gold, silver, tin, or any or all of their alloys. It allows fast heat dissipation and uses the metal dissipating layer 26 as the medium for the die binding process for attaching the frame of the LED.

Figure 5:
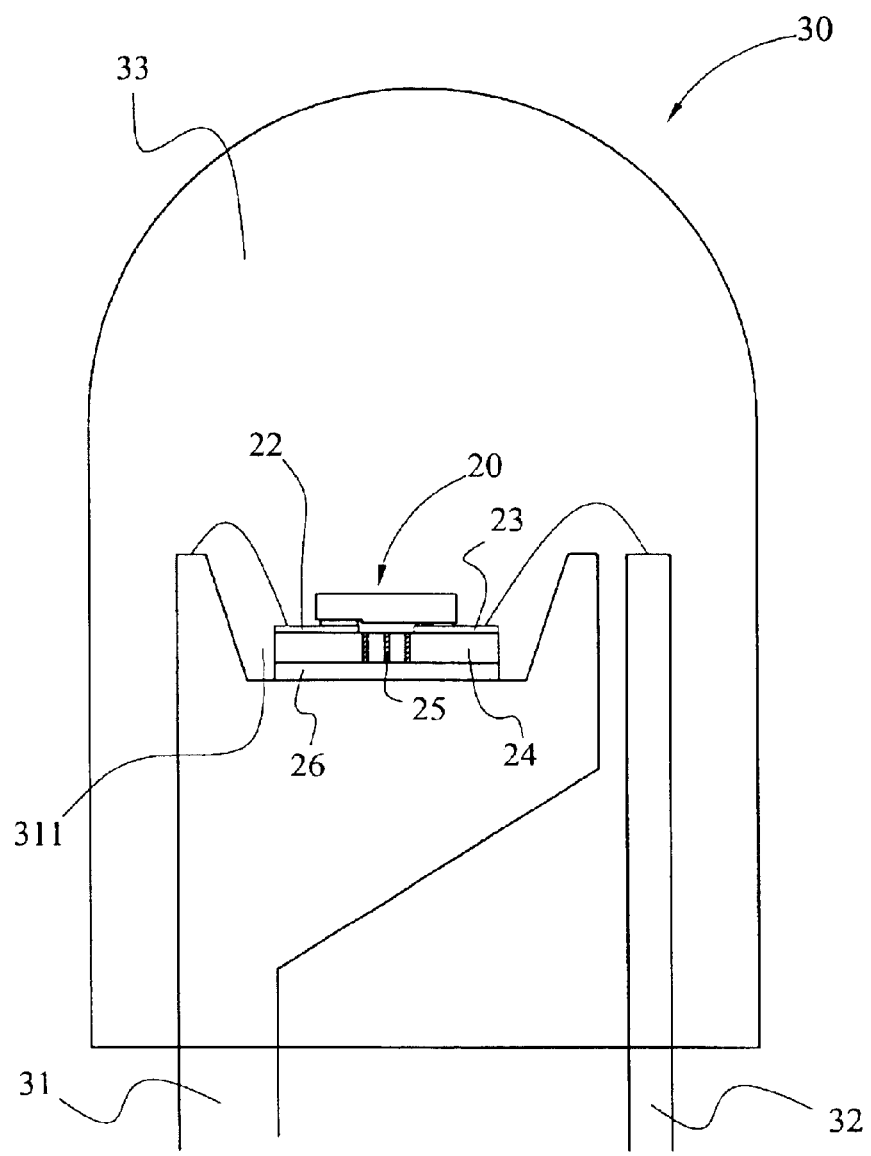
FIG. 5 illustrates the second embodiment of the invention.

Please refer to FIG. 5 for the second embodiment, which applies the invention as the light source of the LED. After the light emitting chip is packaged, it forms the LED 30 shown in the illustration. The light emitting chip 20 is attached inside the groove 311 of the frame 31. After securing the chip, it is then wire bonded so the p-electrode 22 of the light emitting chip 20 is electrically connected to the frame 31, and the n-electrode 23 is electrically connected to the frame 32. Finally, epoxy resin 33 is used to seal the packaging to form the LED 30 shown in the illustration. Using the conducting cylinders 25 on the emitting structure of the light emitting chip of the invention, the heat energy of the LED can be well dissipated after the chip is electrically connected. As shown in the illustration, the bottom of the heat dissipated substrate 24 is connected to the bottom of groove 311 of frame 31, so each of the conducting cylinders 25 of the heat dissipating substrate 24 is also in direct contact with the bottom of the groove 311. Therefore, the heat conducting cylinders 25 can quickly transfer heat to the frame 31 and disperse it. Also, the design of the heat conducting cylinders 25 allows the heat energy of the heat dissipating substrate 24 to be dispersed quickly and thus increases efficiency.

Figure 6:
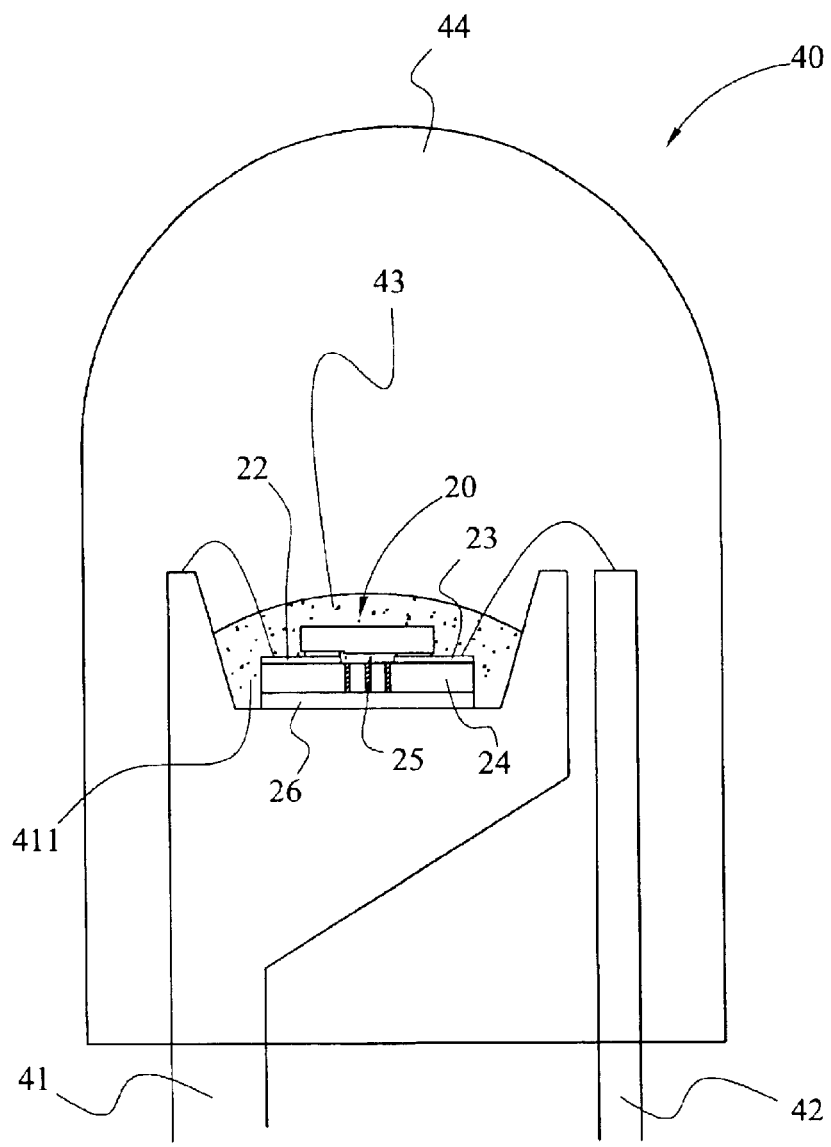
FIG. 6 illustrates the third embodiment of the invention.

Please refer to FIG. 6 for an illustration of the third embodiment of the invention, which packages the invention into a color mixing wavelength LED 40. As shown in the illustration, the light emitting chip 20 disclosed by the invention is secured in the groove 411 of the frame 41 and then wired so the p-electrode 22 of the light emitting chip 20 is electrically connected to the frame 41, and the n-electrode 23 is electrically connected to the frame 42. After the wiring process, a light hybrid layer 43 covers the light emitting chip 20 completely inside the groove 441. Once electricity flows through, the light generated by the light emitting chip 20 illuminates the light hybrid layer 43 and excites the different materials in the light hybrid layer 43 to change the wavelength, and outputs a light of mixed color. The light hybrid layer is composed of a mixture of scattering particles, fluorescent particles and diffracting particles. The materials for the scattering particles are quartz, glass, or other transparent materials. The materials for diffracting particles are any of the following materials or combinations thereof: TiBaO, titania, silicon oxide, silicon dioxide, barium sulfate or calcium carbonate. Fluorescent particles are composed of inorganic fluorescent material.

Figure 7:
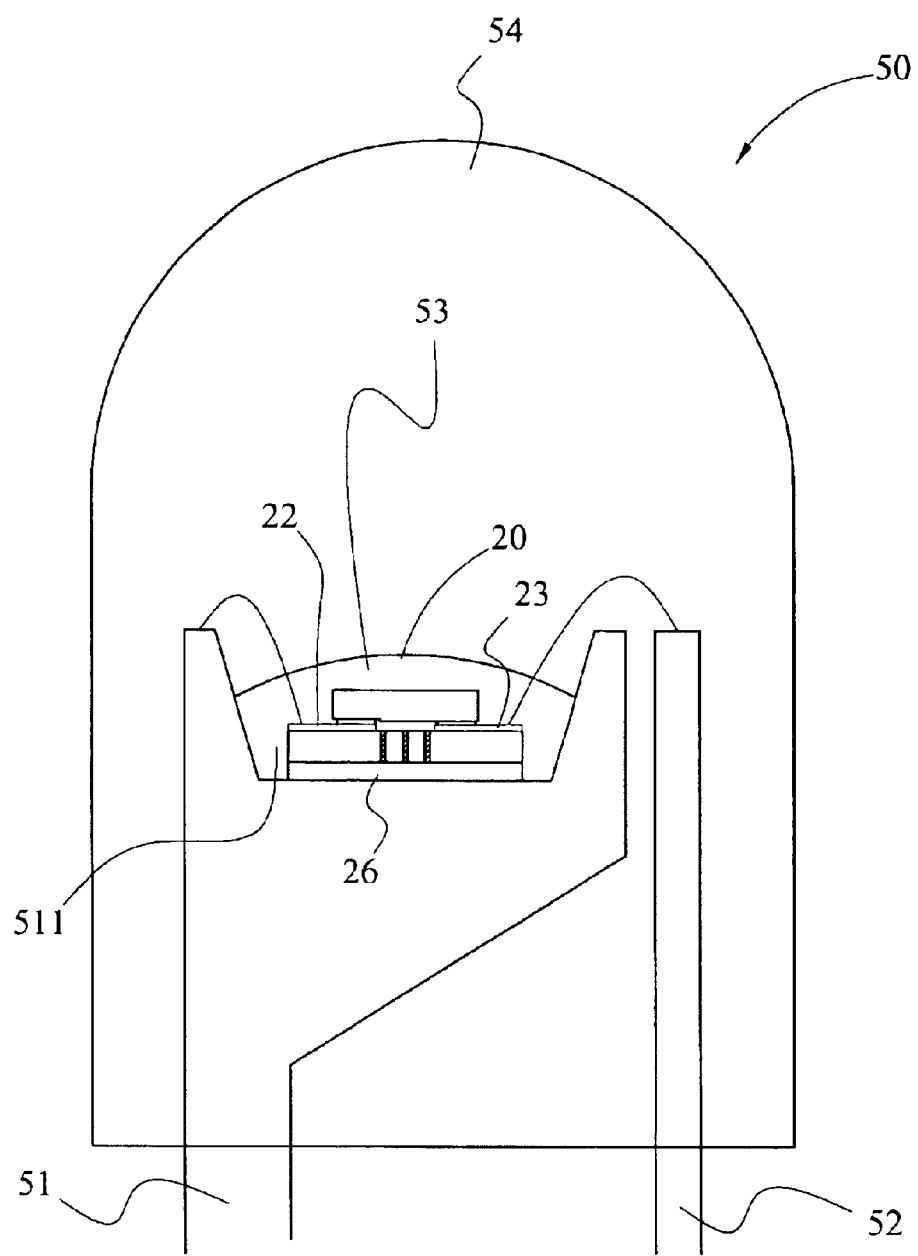
FIG. 7 illustrates the forth embodiment of the invention.

Please refer to FIG. 7 for an illustration of the forth embodiment of the invention. As shown in the illustration, the disclosed light emitting chip 20 is secured inside the groove 511 of the frame 51 and wire bonded, so the p-electrode 22 and the frame 51 are electrically connected, and the n-electrode 23 and the frame 52 are electrically connected. After the wire bonding procedure, a fluorescent layer 53 is used to cover the light emitting chip 20 completely inside the groove 511. The goal is to use the light generated from the light emitting chip 20 to illuminate the covering fluorescent layer 53 and generate a light wave of different wavelength. Because the fluorescent layer covers the chip, the light generated by the chip and the light of a different wavelength are mixed and a different colored light is displayed. Therefore, the manufacture can use appropriate inorganic fluorescent material to generate light of different colors according to demand. For embodiment, a light emitting chip composed of silicon nitride can be matched with YAG (yttrium aluminum garnet) powders, fluorescent materials of lanthanide aluminates or silicates of alkaline-earth metal.

Figure 8:
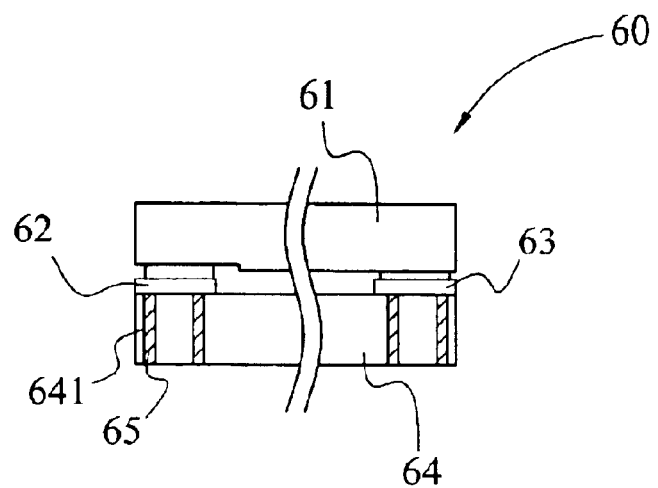
FIG. 8 illustrates the fifth embodiment of the invention.
Figure 9:
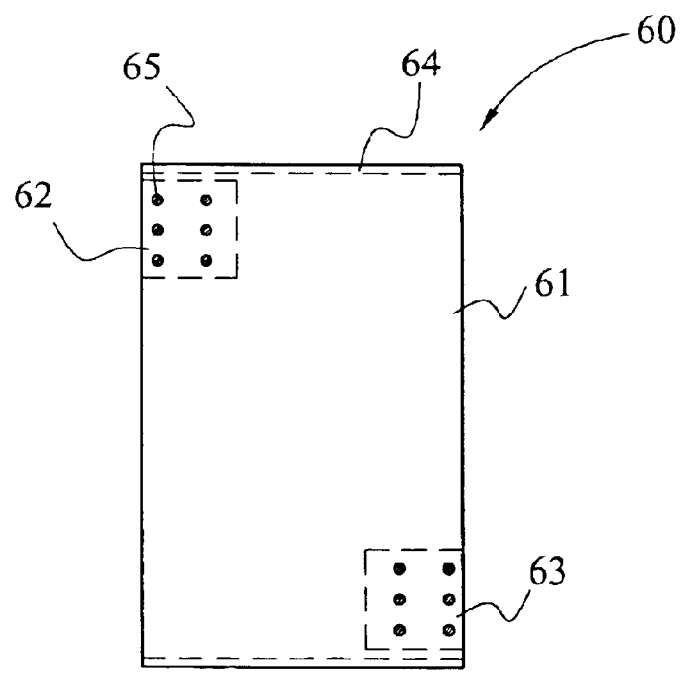
FIG. 9 illustrates, in two-dimensional view, the fifth embodiment of the invention.

Please refer to FIG. 8 for an illustration of the fifth embodiment of the invention. As shown in the illustration, the light emitting chip 60 is composed of an epitaxy chip 61, two electrodes 62 and 63, and a heat dissipating substrate 64. The light emitting chip 60 has the electrodes 62 and 63 on the bottom surface of the epitaxy chip 61 instead of on the outside of the epitaxy chip 61. Several openings are formed at the connecting points of the heat dissipating substrate 64 and the electrodes 62 and 63, and heat cylinders 65 are formed in the openings (please refer to FIG. 9). This design allows the heat energy to be transferred directly from the electrodes 62 and 63 to the heat dissipating substrate 64. This kind of light emitting chip 60 does not need any wire bonding procedure and can be packaged directly after die biding.

Figure 10:
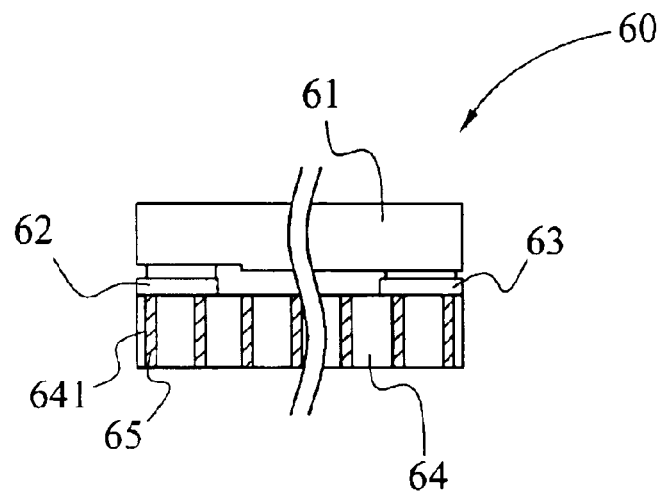
FIG. 10 illustrates the sixth embodiment of the invention.
Figure 11:
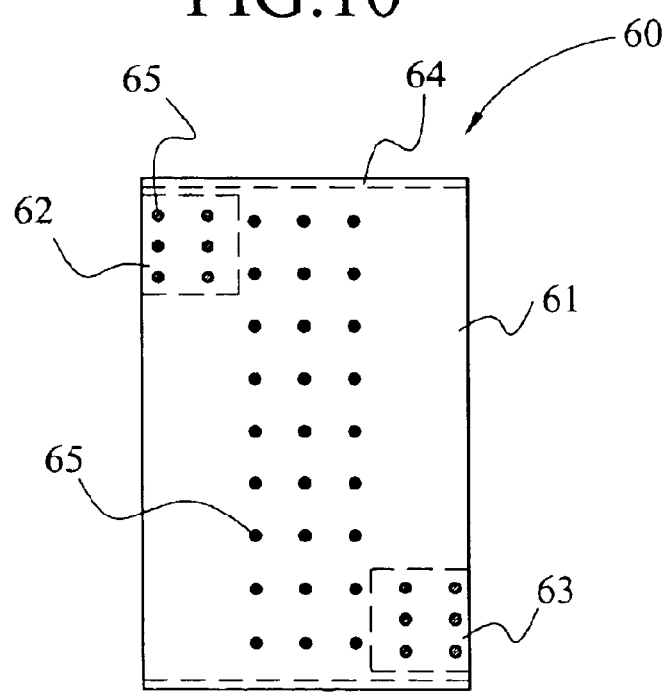
FIG. 11 illustrates, in two-dimensional view, the sixth embodiment of the invention.

Please refer to FIG. 10 for the sixth embodiment of the invention. As shown in the illustration, the light emitting chip 30 has several heat conducting cylinders 65 placed on the heat dissipating substrate (please refer to FIG. 11). These heat conducting cylinders are connected to the electrodes 62 and 63 and transfer heat energy directly to the heat dissipating substrate 64. Cylinders 65 not in contact with the electrodes allow heat to be distributed quickly and evenly through all compartments of the heat dissipating substrate 64, and has a better heat dissipation result is achieved.

As described above, the heat dissipating structure of the light emitting chip of the invention provides two ways of heat dissipation for the chip. One uses the good heat dissipation properties of the heat dissipating substrate, and the other uses the heat conducting cylinders on the substrate. Using the cylinders, the heat energy on the heat dissipating substrate can then be dispersed quickly and more efficiently than using only the heat dissipating substrate. The heat dissipating structure of the light emitting chip of the invention provides the following advantages:

1. The heat dissipating substrate allows heat energy to be dispersed quickly, so the working temperature of the light emitting chip does not get too high.
2. The heat conducting cylinders allows heat energy to be dispersed quickly and increases the efficiency of the heat dissipating substrate.
3. The improved heat dissipation efficiency allows higher power sustentation for the light emitting chip and increases its applications.

In conclusion, the heat dissipating structure can provide good heat dissipation for a light emitting chip and allows higher power sustentation, thus increasing the application area of the light emitting chip.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A light emitting chip with a heat dissipating structure, applied in a light emitting diode (LED) as a light source, the light emitting chip comprising:

an epitaxy chip, having a lower surface attached with plural metal blocks;

a heat dissipating substrate, having an upper surface attached with a p-electrode and an n-electrode, the p-electrode and the n-electrode being positioned corresponding to the metal blocks on the epitaxy chip and being in contact with the metal blocks, the heat dissipating substrate having plural openings thereon; and plural heat conducting cylinders with high heat dissipating characteristics, formed inside of the openings on the epitaxy chip.

2. The light emitting chip as claimed in claim 1, wherein the heat conducting cylinder is composed of In, Pd, or an alloy of In and Pd.

3. The light emitting chip as claimed in claim 1, wherein the heat dissipating substrate is a ceramic substrate.

4. The light emitting chip as claimed in claim 1, wherein the heat dissipating substrate is composed of aluminum oxides.

5. The light emitting chip as claimed in claim 1, wherein the heat dissipating substrate is composed of aluminum nitrides.

6. The light emitting chip as claimed in claim 1, wherein the heat dissipating substrate has a lower surface connected to a metal heat-dissipating layer.

* * * * *